(12) United States Patent
Hackenberg

(10) Patent No.: US 6,526,995 B1
(45) Date of Patent: Mar. 4, 2003

(54) BRUSHLESS MULTIPASS SILICON WAFER CLEANING PROCESS FOR POST CHEMICAL MECHANICAL POLISHING USING IMMERSION

(75) Inventor: Diana L. Hackenberg, W. Melbourne, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/342,948

(22) Filed: Jun. 29, 1999

(51) Int. Cl.⁷ .................................................. B08B 3/12
(52) U.S. Cl. ................ 134/1.3; 134/1; 134/2; 134/3; 134/26; 134/28; 134/29; 134/902
(58) Field of Search ........................... 134/1, 1.3, 2, 3, 134/26, 27, 28, 29, 902

(56) References Cited

U.S. PATENT DOCUMENTS

| 4,261,791 | A | | 4/1981 | Schwartzman |
|---|---|---|---|---|
| 5,078,801 | A | | 1/1992 | Malik |
| 5,656,097 | A | | 8/1997 | Olesen et al. |
| 5,662,769 | A | | 9/1997 | Schonauer et al. |
| 5,679,169 | A | | 10/1997 | Gonzales et al. |
| 5,849,091 | A | | 12/1998 | Skrovan et al. |
| 5,855,811 | A | | 1/1999 | Grieger et al. |
| 5,996,594 | A | | 12/1999 | Roy et al. |
| 5,996,595 | A | * | 12/1999 | Olesen et al. ............. 134/1.3 |
| 6,036,785 | A | * | 3/2000 | Ferrell ............................ 134/1 |

FOREIGN PATENT DOCUMENTS

EP        0999012 A2    5/2000

* cited by examiner

*Primary Examiner*—Randy Gulakowski
*Assistant Examiner*—J Smetana
(74) *Attorney, Agent, or Firm*—Fogg and Associates, LLC

(57) ABSTRACT

A method for removing a slurry from a silicon wafer after chemical-polishing whereby the wafer is subjected to at least 2 or more chemical megasonic baths for a short duration of time. The pH of the first megasonic bath matches the pH of the slurry to be removed.

18 Claims, No Drawings

BRUSHLESS MULTIPASS SILICON WAFER CLEANING PROCESS FOR POST CHEMICAL MECHANICAL POLISHING USING IMMERSION

BACKGROUND OF THE INVENTION

After semiconductors are manufactured, they are subjected to chemical-mechanical polishing (CMP). The most common way to clean silicon wafers after chemical mechanical polishing is with a brush cleaning tool. The problem with such as system is that the abrasiveness of the brush often damages the wafer. Alternatively, there are some systems where spray tools are employed to clean wafer surfaces. These methods do not have optimal cleaning ability. Another technique is to use megasonics combined with immersion into other solvents. This technique, and the chemicals used is described in detail below.

Megasonics

Megasonics is a cleaning method for contamination-sensitive products. Integrated circuit, hard drive, raw silicon, mask, flat panel display, and other devices affected by contamination are cleaned using megasonics to help meet stringent cleanliness requirements. The megasonic method is commonly employed to clean semiconductor wafers themselves. A megasonic cleaning system uses high frequency (700–1,000 KHz) acoustic energy pressure waves produced in a liquid. The liquid is contained in a cleaning tank. Because the pressure waves are effective for removing particles from silicon wafers without causing damage to the wafers themselves, it is an excellent nondestructive cleaning technique. Megasonics maybe used to effectively removing 0.15-micron particles from silicon wafers and other products, without damage.

Megasonics cleaning uses the piezoelectric effect (the generation of electric polarization in certain dielectric crystals as a result of the application of mechanical stress) to enable removal of submicron particles from substrates. A ceramic piezoelectric crystal is excited by high-frequency AC voltage, causing it to vibrate. This vibration generates an acoustic wave that is transmitted to and through the cleaning fluid, producing controlled cavitation. Cavitation is the formation of gas bubbles within the liquid created by the application of mechanical force. Because the cavitation is formed by acoustic waves, it is said that megasonic employs "acoustic cavitation." Acoustic cavitation is caused by the pressure variations in sound waves moving through the cleaning fluid. As the acoustic wave passes across the surface of the wafer, particles are removed. Acoustic cavitation provides sufficient energy to overcome particle adhesion forces and cause particles to be removed. Controlled megasonics cavitation becomes acoustic streaming, which pushes the particles away so they do not reattach to the material being cleaned.

It is useful to contrast megasonic cleaning with ultrasonic cleaning to fully understand the megasonic process. The fundamental difference between ultrasonic cleaning and megasonics cleaning lies in the frequency that is used to generate the acoustic waves. Ultrasonic cleaning uses frequencies between 20–350 kH. These frequencies produce random cavitation. Megasonics cleaning uses higher frequencies at 700–1000 kHz. This produces controlled cavitation.

An important distinction between the two methods is that the higher megasonic frequencies do not cause the violent cavitation effects found with ultrasonic frequencies. This significantly reduces or eliminates cavitation erosion and the likelihood of surface damage to the product being cleaned. Parts that would be damaged by ultrasonic frequencies or cavitation effects can often be cleaned without damage in a megasonic bath using the same solution. With ultrasonics, cavitation occurs throughout the tank, and all sides of submerged parts are cleaned. With megasonics, only the side of the part that is facing the piezo electric device is cleaned.

Chemicals Used in Megasonics

Megasonics cleaning may be used with a variety of chemistries. Although megasonics is used primarily for particle removal, it may also be used to increase the efficiency of chemical cleaning with surfactants or detergents. Removal of other contaminants depends on the solutions in the tank.

Deionized water (DI) water is commonly used in megasonic application. An "ion" is an atom or group of atoms that is not electrically neutral, but instead carries a positive or negative electric charge. As the names suggest, deionized water is water without such ions present. Deionized Water of ultrahigh purity (very low in contaminants) is of high electrical resistance which makes it useful for cleaning various semiconductor substrates.

Wafers are often rinsed in pure DI water after being immersed in a chemical bath both to remove the chemicals, and to further clean the wafer. As relates to megasonics, the chemicals chosen are substances (aqueous or organic) designed to clean the semiconductor wafer (or other assembly) by dissolving the contaminants present on its surface. The rinse of the DI water removes the residue of chemical that still remains on the wafer from previous immersions. DI water has a pH of 7 meaning that it neither an alkaline nor acidic but rather is neutral.

DI water may also be used to dilute the concentration of a chemical in the megasonic bath (or other immersion baths). It is common to mix various chemicals in different concentrations in DI water. One chemical commonly used is ammonia hydroxide. Another is hydrogen peroxide. Hydrogen peroxide is a strong oxidizing chemical used in particle removal chemistries. SC-1, a solution commonly used in megasonics, is a mixture of ammonia hydroxide, hydrogen peroxide and water. Hydrofluoric acid (HF) is also commonly used. Hydrofluoric acid is a corrosive acid used in etching and cleaning. It is commonly used for the removal of metals or thin oxides of glass. Another common corrosive acid used in particle removal chemistries is hydrochloric acid (HCL). Hydrochloric acid is commonly found in SC-2 or HPM solution which is a solution used for metallic removal.

Surfactants may also be used in megasonics. A surfactant is a surface active solution, and is used to lower the surface tension of a liquid. Surfactants reduce interfacial tension between two liquids or a liquid and a solid. Because of this property, surfactants reduce the ability for particles to adhere to the wafer. Detergents are made up principally from surfactants. One surfactant commonly used to clean wafers is known as NWC-601.

SUMMARY OF THE INVENTION

It is generally known that exposure time, the length of time the wafer is subjected to the megasonic cleaning process, is an exceptionally important variable affecting megasonics cleaning. Indeed, it is well-known that as exposure time increases, particle redeposition decreases. The inherent problem with using increased exposure times is that cycle time (the time needed to clean each batch of wafers) correspondingly increases, thereby adding additional manufacturing cost and production time. Today, typical exposure times are 10 to 20 minutes. The exposure times of 7 minutes or less are not currently employed for post-chemical mechanical polish or back-grinding operations, and are commonly believed to be insufficient to reach desired levels of cleaning efficiency. What is not known is that using two or more megasonic cycles of shorter duration, as opposed to a single cycle of longer duration, increases cleaning efficiency (the ratio of particles on a material before the cleaning process to the particles remaining after cleaning) without significantly effecting the overall cycle time.

The term "cycle" has a specific meaning in the semiconductor fabrication industry. By "chemical cycle" I mean exposing the wafer to the same, or approximately the same, chemicals in close temporal proximity to achieve a desired result. One aspect of my invention is performing one "chemical cycle" as two separate megasonic chemical "sub-cycles." Preferably, the very chemical bath of the first chemical megasonic sub-cycle is used again for the second chemical megasonic sub-cycle, and there is a rinse in between. Where the megasonic chemical bath is not a sub-cycle, it is simply labeled a "chemical megasonic cycle" instead of a "chemical megasonic sub-cycle." Thus, I have used the terms "first chemical megasonic sub-cycle" and "second megasonic sub-cycle" because they form a single chemical megasonic cycle. However, I have used the term "third chemical megasonic cycle" and "fourth chemical megasonic cycle" because they are not sub-cycles and constitute complete individual chemical cycles by themselves.

There are other advantages to shortened exposure times. For instance, shorter exposure times allows the same chemicals to be used for a larger number of lots. Also, since the wafers are rinsed more frequently, the chemical baths themselves retain less contamination.

The main forces adhering particles to the surface of the wafers are Van der Waals forces (weak forces), electrostatic forces, and chemical bonds. (Van der Waals forces are weak attractive forces between two atoms or non-polar molecules, which arises because a fluctuating dipole moment in one molecule induces a dipole moment in another molecule, and then the two dipole moments interacting.) Another discovery regards the matching of the pH level of the solutions to be used to the pH of the particles to be removed from the surface. The pH adjustment improves the efficiency of breaking the electrostatic forces holding the contamination to the surface of the substance to be cleaned. The current practice is to use SC-1 solution at a standard ratio of 5 parts DI water, 1 part ammonia hydroxide, and 1 part hydrogen peroxide.

Previously, it had been thought that it was not desirable to match the pH of the chemical solution to the substance being removed from the wafer. For instance, it was thought that if the substance to be removed is alkaline (pH over 7 to 14) that the chemical should be acidic (pH from 0 to under 7), and vice versa. To the contrary, I discovered that matching the pH of the chemical solution to the pH of the substance to be removed is desirable because it increases cleaning efficiency. When the pH level of the chemical is matched to the pH level of the substance being removed, the chemical is not trying to dissolve the substance to be removed. Nor is the chemical trying to change the solution to be removed into a salt or anything other substance. (It is commonly known that the admixture of an alkaline substance to an acid produces salt and water.) This quality makes immersion into the cleaning solution easier. For instance, the formation of salt has been shown to be particularly pernicious to the cleaning process.

In my invention, a multi-pass wafer cleaning process employs immersions baths, megasonic units, and various chemistries to clean the slurry from the wafers and leave the wafers low in particles and metals. The act of subjecting the wafer to a chemical in the megasonic bath is termed a "chemical megasonic sub-cycle cycle." Because the invention contemplates more than one chemical megasonic sub-cycle, I have employed the term "first megasonic cycle," "second megasonic cycle," etcetera to indicate each one. The term "first" however is not to be construed as first in order. The periods of time for the first megasonic time being 20 minutes, 17 minutes, 14 minutes, 11 minutes, 9 minutes, 6 minutes, 4 minutes, 2 minutes, 1 minute are contemplated in my invention.

A slurry is a free flowing suspension of fine solid material in liquid. Slurries are semifluid substances, which usually are a mixture of abrasive compounds in an aqueous solution. The slurry is intentionally added during the chemical mechanical polishing (CMP) stage to smooth the wafers. The invention is facilitated by the discovery that during the initial (first to be performed) chemical megasonic sub-cycle, it is best to match the pH of the chemical, preferably SC-1, to the pH of the slurry to be removed.

The invention also employs a number of megasonic cycles whereby the wafer is immersed in a megasonic bath of pure DI water. These are termed "DI water rinse cycles." Again, the terms "first DI water rinse cycle," "second DI water rinse cycle" etcetera, are employed. While the invention could be performed without the use of the DI water megasonic rinsing, the cleaning efficiency improves dramatically with such rinsing. This allows one batch of semiconductors to be in the megasonic unit while another batch is being rinsed. In the preferred embodiment, all the steps of the method are continuously performed such that the wafers do not dry until the process is complete.

Some of the rinse cycles may be performed using a quick dump rinser. In a dump rinser, wafers are placed into a dry rinser and immediately sprayed with DI water. While they are being sprayed, the cavity of the rinser is rapidly filled with water. As the water over overflows the top, a trap door in the bottom swings open and the water is dumped instantly into the drain system. This fill-and-dump action is repeated several times until the wafers are entirely mixed. Dump rinsing is favored because all of the rinsing takes place in one cavity, which saves equipment and space. It is also a system that can be automated, so that he operation needs to load the wafers in (this can be done automatically) and push a button.

DETAILED DESCRIPTION OF PREFERRED EMBODIMENT OF THE INVENTION

Detailed embodiments of my invention are disclosed herein. However, the disclosed embodiments are merely exemplary of my invention, which may be embodied in various forms not characterized by the preferred embodiments. Therefore, specific structural and functional details disclosed herein are not to be interpreted as limiting, but merely as a basis for the claims and a representative basis for teaching one skilled in the art to variously employ my invention in any detailed structure. What follows is a preferred embodiment of the invention. Embodiments other than the preferred embodiment are contemplated in the claims.

I have invented a unique new process to clean wafers using the following steps to be performed in sequence:

(a) First a wafer is dipped in a dilute surfactant such as NWC-601, preferably for 5 to 10 minutes. This is called a "surfactant dip."

(b) Next, the wafers are subjected to a "first chemical megasonic sub-cycle." This is a megasonic bath with a chemical that has a pH of the substance to be removed. It is contemplated that subject to be removed is a slurry from the chemical-mechanical polishing (CMP) process, and that the pH of the chemical should match the pH of the slurry to be removed. Preferably, this chemical should be a dilute solution of ultra-pure DI water, ammonium hydroxide and hydrogen peroxide (which form SC-1) for 2 to 10 minutes. The ammonia peroxide should range from about 0.8% to about 3% by volume in DI water. The hydrogen peroxide should range from about 1.5% to 6% hydrogen peroxide by volume in DI water. The solution temperature is in the range from room temperature to about 50 degrees Celsius.

The slurry to be removed has potassium-hydroxide and small silicon-oxide particles. The slurry is diluted with water before it is used to polish the surfaces. Potassium hydroxide, also found in the slurry, makes the slurry alkaline. By using enough SC-1 that of similar alkalinity to match the pH of the slurry, cleaning efficiency increases. Prior to dilution, the SC-1 has a pH of about 13 to 14. After dilution, the SC1 has a pH of about 10 to about 11, which matches the pH of the slurry to be removed. The bulk of the slurry is removed during this pass.

(c) Next, the wafer is rinsed for a "first rinse cycle" in an ultra-pure DI water rinse with a megasonic unit.

(d) Next, the wafer is immersed again for a second chemical megasonic sub-cycle in a megasonic bath with a dilute solution of ultra-pure DI water, ammonium hydroxide and hydrogen peroxide for 2 to 10 minutes. As before, the ammonia peroxide ranges from about 0.8% to about 3% by volume in DI water, and the hydrogen peroxide ranges from about 1.5% to 6% hydrogen peroxide by volume in DI water. Again, the solution temperature ranges from room temperature to 50 degrees Celsius. The first chemical megasonic sub-cycle and the second chemical megasonic sub-cycle form a single chemical cycle. Preferably, the actual bath used in the first chemical megasonic sub-cycle is used in the second chemical megasonic sub-cycle.

(e) Next, the wafer is rinsed for a second rinse cycle in an ultra-pure DI water rinse with a megasonic unit.

(f) The wafer is then dipped in a dilute hydrofluoric acid (40:1) for about 15 to about 40 seconds. This is called a "hydrofluoric acid dip."

(g) Next, the wafer is rinsed again for a third rinse cycle in an ultra-pure DI water rinse with a megasonic unit or a quick dump rinser. The first two rinse cycles must be performed with megasonics. The rinse cycles thereafter may be, but need not.

(h) Next, the wafers are dipped into a solution of sulfuric acid and hydrogen peroxide at 80 degrees Celsius for 15 to 40 seconds. This is called a "sulfuric acid and hydrogen peroxide dip."

(i) Next, the wafers are rinsed again a fourth rinse cycle in an ultra-pure DI water rinse with a megasonic unit, or a quick dump rinser.

(j) Next, the wafer is immersed for a third chemical megasonic cycle in a megasonic bath with a dilute solution of ultra-pure DI water, ammonium hydroxide and hydrogen peroxide, this time for 2 to 6 minutes. The ammonia peroxide ranges from about 0.8% to about 3% by volume in DI water. The hydrogen peroxide ranges from about 1.5% to 6% hydrogen peroxide by volume in DI water. The solution temperature ranges from room temperature to 50 degrees Celsius.

(k) The wafers are then rinsed for a fifth rinse cycle in an ultra-pure DI water rinse with a megasonic unit, or a quick dump rinser.

(l) Next, the wafer is immersed for a fourth chemical megasonic cycle in a megasonic bath with a dilute solution of ultra-pure DI water, hydrochloric acid and hydrogen peroxide, for 2 to 6 minutes. The hydrochloric acid ranges from about 7 to about 13% by volume in DI water; the hydrogen peroxide ranges from about 7 to 13% hydrogen peroxide by volume in DI water. The aforementioned chemicals are commonly known as SC-2 in the industry. The solution temperature ranges from room temperature to 50 degrees Celsius.

(m) the wafers are then rinsed for a fifth rinse cycle in an ultra-pure DI water rinse with a megasonic unit, or a quick dump rinser.

In the preferred embodiment, the aforementioned steps are to be performed sequentially. The steps are performed rapidly enough so that the wafers do not have a chance to dry. It is preferable that both the megasonic and immersion baths are re-circulate baths with filters so that the chemicals can be used for multiple cycles.

I claim:

1. A method of cleaning a silicon wafer to remove a contaminant, said method comprising the sequential steps of:

immersing the wafer in a first chemical megasonic bath for a first sub-cycle lasting for a first period of time;

immediately subjecting the wafer to a single megasonic rinse with deionized water; and immediately immersing the wafer in a second chemical megasonic bath having substantially the same chemical composition as said first chemical megasonic bath for a second sub-cycle lasting for a second period of time, said first and second sub-cycles separated from one another by said single deionized water megasonic rinse comprising a single chemical cycle.

2. The method of cleaning a wafer of claim 1 wherein the wafer remains wet between the first sub-cycle and the second sub-cycle.

3. The method of cleaning a silicon wafer of claim 1 wherein the sum of the time for the periods of the first sub-cycle and the second sub-cycle does not exceed 20 minutes.

4. The method of cleaning a silicon wafer of claim 1 wherein the sum of the time for the periods of the first sub-cycle and the second sub-cycle does not exceed 15 minutes.

5. The method of cleaning a silicon wafer of claim 1 wherein the sum of the time for the periods of the first sub-cycle and the second sub-cycle does not exceed 10 minutes.

6. The method of cleaning a wafer of claim 1 wherein the first and second megasonic baths both respectively consist of a solution of water, ammonium hydroxide and hydrogen peroxide.

7. The method of cleaning a wafer of claim 1 wherein the contaminant and the first chemical megasonic bath have approximately matching pH values.

8. The method of claim 1 wherein said first chemical megasonic bath and said second chemical megasonic bath, are the same bath.

9. The method of cleaning a wafer of claim 1 wherein the first and second megasonic baths both respectively consist of a solution of DI water, about 0.8% to about 3% ammonium hydroxide by volume and about 1.5% to about 6% hydrogen peroxide by volume.

10. The method of claim 9 wherein said first chemical megasonic bath and said second chemical megasonic bath, are the same bath.

11. A method of cleaning a silicon wafer to remove a contaminant, said method comprising the sequential steps of:

immersing the wafer in a first chemical megasonic bath for a first sub-cycle lasting for a first period of time;

immersing the wafer in a second chemical megasonic bath for a second sub-cycle lasting a second period of time, said first and second sub-cycles comprising a single chemical cycle;

dipping the wafer in a solution of hydrofluoric acid and water;

dipping the wafer in a solution of sulfuric acid and hydrogen peroxide;

immersing the wafer in a third chemical megasonic bath for a chemical cycle; and immersing the wafer in a fourth chemical megasonic bath for a chemical cycle.

12. The method of claim 11 wherein the first, second, and third chemical megasonic baths are a solution of water, ammonium hydroxide and hydrogen peroxide, and the fourth chemical megasonic bath is a solution of water, hydrochloric acid, and hydrogen peroxide.

13. The method of claim 11 wherein the contaminant and the first chemical megasonic bath have approximately matching pH values.

14. The method of claim 11 wherein the first and second chemical megasonic baths have substantially the same chemical composition.

15. A method of cleaning a silicon wafer to remove a contaminant, said method comprising the sequential steps of:

immersing the wafer in a first chemical megasonic bath for a first sub-cycle lasting for a first period of time;

immersing the wafer in a second chemical megasonic bath for a second sub-cycle lasting a second period of time, said first and second sub-cycles comprising a single chemical cycle;

dipping the wafer in a solution of hydrofluoric acid and water;

immersing the wafer in a third chemical megasonic bath for a chemical cycle;

dipping the wafer in a solution of sulfuric acid and hydrogen peroxide; and immersing the wafer in a fourth chemical megasonic bath for a chemical cycle.

16. The method of claim 15 wherein the first, second, and third chemical megasonic baths are a solution of water, ammonium hydroxide and hydrogen peroxide, and the fourth chemical megasonic bath is a solution of water, hydrochloric acid, and hydrogen peroxide.

17. The method of claim 15 wherein the contaminant and the first chemical megasonic bath have approximately matching pH values.

18. The method of claim 15 wherein the first and second chemical megasonic baths have substantially the same chemical composition.

* * * * *